(12) United States Patent
Brück et al.

(10) Patent No.: US 9,087,959 B2
(45) Date of Patent: Jul. 21, 2015

(54) DEVICE FOR GENERATING ELECTRIC ENERGY FROM A HEAT-CONDUCTING MATERIAL

(75) Inventors: Rolf Brück, Bergisch Gladbach (DE); Sigrid Limbeck, Much (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 0 days.

(21) Appl. No.: 13/544,055

(22) Filed: Jul. 9, 2012

(65) Prior Publication Data

US 2012/0273020 A1   Nov. 1, 2012

Related U.S. Application Data

(63) Continuation of application No. PCT/EP2011/050086, filed on Jan. 5, 2011.

(30) Foreign Application Priority Data

Jan. 8, 2010   (DE) .......................... 10 2010 004 200

(51) Int. Cl.
   *H01L 35/30*   (2006.01)
(52) U.S. Cl.
   CPC ...................... *H01L 35/30* (2013.01)
(58) Field of Classification Search
   CPC ........................................... H01L 35/30
   USPC ................................ 136/200–242
   See application file for complete search history.

(56) References Cited

U.S. PATENT DOCUMENTS

| 7,111,465 B2 | 9/2006 | Bell |
| 2004/0076214 A1 | 4/2004 | Bell |
| 2005/0072454 A1 | 4/2005 | Cohen et al. |
| 2008/0142069 A1* | 6/2008 | Lindstrom .................... 136/242 |
| 2010/0006132 A1 | 1/2010 | Hodes |
| 2010/0257871 A1 | 10/2010 | Venkatasubramanian et al. |
| 2011/0247668 A1 | 10/2011 | Bell et al. |
| 2011/0277801 A1* | 11/2011 | Fuchs et al. .................... 136/201 |

FOREIGN PATENT DOCUMENTS

| DE | 202008000832 U1 | 3/2008 |
| DE | 102007063172 A1 | 7/2009 |
| DE | 102008043346 A1 | 5/2010 |
| JP | 2000352313 A | 12/2000 |
| JP | 2006211780 A | 8/2006 |
| KR | 1020030082589 A | 10/2003 |
| UA | 71776 A | 12/2004 |

(Continued)

OTHER PUBLICATIONS

International Search Report of PCT/EP2011/050086.

*Primary Examiner* — Jeffrey T Barton
*Assistant Examiner* — Niki Bakhtiari
(74) *Attorney, Agent, or Firm* — Laurence A. Greenberg; Werner H. Stemer; Ralph E. Locher

(57) ABSTRACT

A device for generating electric energy includes at least one heated heat-conducting main body, at least one projection and thermoelectric elements laterally attached to the at least one projection. A thermoelectric efficiency of each thermoelectric element and a heat output of the at least one projection are matched to each other.

7 Claims, 3 Drawing Sheets

(56) References Cited

FOREIGN PATENT DOCUMENTS

| WO | 02065030 A1 | 8/2002 |
| WO | 2005/074463 A2 | 8/2005 |
| WO | 2008/013946 A2 | 1/2008 |
| WO | 2010008495 A2 | 1/2010 |
| WO | WO2010063044 * | 6/2010 |

* cited by examiner

DEVICE FOR GENERATING ELECTRIC ENERGY FROM A HEAT-CONDUCTING MATERIAL

CROSS-REFERENCE TO RELATED APPLICATION

This is a continuation, under 35 U.S.C. §120, of copending International Application No. PCT/EP2011/050086, filed Jan. 5, 2011, which designated the United States; this application also claims the priority, under 35 U.S.C. §119, of German Patent Application DE 10 2010 004 200.5, filed Jan. 8, 2010; the prior applications are herewith incorporated by reference in their entirety.

BACKGROUND OF THE INVENTION

Field of the Invention

The invention relates to a device for generating electrical energy from thermal energy, which is provided with a heat-conducting material. Such devices are known, for example, as thermoelectric generators and may be used in exhaust systems of internal combustion engines of motor vehicles.

In the exhaust treatment of mobile internal combustion engines, such as for example gasoline and diesel engines, it is attempted today to treat the exhaust gases in such a way that, when they are emitted into the environment, they have been cleaned almost completely. It is also attempted to convert any form of unused emitted energy into a usable form of energy.

Exhaust gas from an engine of a motor vehicle has thermal energy, which can be transferred by a thermal contact to a heat-conducting material and converted into electrical energy through the use of a thermoelectric generator in order, for example, to charge a battery or other energy storage device and/or supply the required energy directly to electrical consumers. In that way, a greater amount of energy is available for operating the motor vehicle.

Such a thermoelectric generator usually has a plurality of thermoelectric transducer elements. Thermoelectric materials used therefor are of such a kind that they can effectively convert thermal energy into electrical energy (Seebeck effect) and vice versa (Peltier effect). The "Seebeck effect" is based on the phenomenon of the conversion of thermal energy into electrical energy and is used for generating thermoelectric energy. The "Peltier effect" is the reverse of the Seebeck effect and is a phenomenon that accompanies heat adsorption and is caused by a current flowing through different materials. The Peltier effect has already been proposed. for example, for thermoelectric cooling.

Such thermoelectric transducer elements preferably have a multiplicity of thermoelectric elements, which are positioned between a so-called "hot side" and a so-called "cold side." Thermoelectric elements include, for example, at least 2 semiconductor blocks (p and n doped), which are connected on their upper side and underside (towards the "hot side" and "cold side") alternately to electrically conducting bridges. Ceramic sheets or ceramic coatings and/or similar materials serve for insulating the metal bridges and are consequently preferably disposed between the metal bridges. If a temperature gradient is provided on the two sides of the semiconductor blocks, an electrical voltage potential is formed. In that case, heat is taken up at one contact point ("warm side"), with the electrons passing from one side to the higher-energy conduction band of the following block. On the other side, the electrons can then release energy to return to the other side at a lower energy level ("cold side"). Consequently, given a corresponding temperature gradient, a flow of current can occur.

The use of corresponding thermoelectric generators for application in motor vehicles, in particular passenger motor vehicles, is already known to the extent that the thermoelectric generators are inserted in the stream of exhaust gas, with the thermal energy being transferred by heat radiation. However, the following discussion concentrates on the use of thermoelectric generators on solid heat-conducting surfaces, and therefore the thermal energy is intended to be transferred by heat conduction. However, the generation of electrical energy from such heat sources has not so far been efficient enough.

SUMMARY OF THE INVENTION

It is accordingly an object of the invention to provide a device for generating electric energy from a heat-conducting material, which overcomes the hereinafore-mentioned disadvantages and at least partially solves the highlighted problems of the heretofore-known devices of this general type. It is sought, in particular, to provide a thermoelectric generator that allows improved efficiency with regard to the conversion of available thermal energy into electrical energy and is also suitable specifically for (steady-state) continuous operation and for the extraction of the thermal energy from a heat-conducting material.

With the foregoing and other objects in view there is provided, in accordance with the invention, a device for generating electrical energy. The device comprises at least one heated heat-conducting main body, at least one projection associated with the heated heat-conducting main body and delivering a heat output, and a plurality of thermoelectric elements attached laterally to the at least one projection and having a thermoelectric efficiency, the thermoelectric efficiency of each of the thermoelectric elements and the heat output delivered by the at least one projection being matched, adapted or adjusted to one another.

This device is, in particular, a so-called thermoelectric generator. The heated main body may be formed, for example, by an exhaust pipe, part of an internal combustion engine or some other metal body. Other heat-conducting materials are also conceivable. Solid bodies with a high thermal capacity are preferably used.

The heating of the main body may be provided by a flame, a stream of exhaust gas, an electrical heater, water and/or some other heat source. The main body is particularly heated intermittently and, due to its thermal capacity, delivers heat uniformly by way of the opposite side. The projection may be thought of, for example, as taking the form of a pin which protrudes from the heated main body opposite the heating device. A number of projections are preferably formed, in order to increase the surface area of the material and thus attach a greater number of thermoelectric elements. The word "attach" means in this connection to captively fasten, adhesively bond, braze, weld, etc. or uniformly distribute over at least 50% of the surface area of the projection, preferably over at least 80% of the surface area of the projection, particularly preferably over at least 95% of the surface area of the projection. The thermoelectric elements are thereby attached to the projections in such a way that they are in direct thermal contact with them. The heated main body thereby forms the separation between the hot side and the cold side of the thermoelectric element, with the projections extending in the direction of the cold side. Each projection generally has a base, a tip or a front and a circumferential surface. The word "laterally" means in this connection that the thermoelectric elements are attached to the circumferential surface between the base and the tip or the front and either run parallel to this surface and/or are at an angle thereto.

In particular, the main body is a heating body of an auxiliary heating device (pre-heating device, park heating device), so that the projections disposed on the main body protrude into the water circuit of the auxiliary heating device. An auxiliary heating device is suitable in particular for use in motor vehicles and, by preheating the cooling water, indirectly brings about heating of the internal combustion engine, so that instances of damage caused by cold starting are avoided. Moreover, such an auxiliary heating device also makes it possible to heat the passenger compartment of the vehicle. In this case, the cold side of the thermoelectric generator is formed by the water circuit of the auxiliary heating device, so that the thermoelectrical elements disposed on the projection are positioned between a hot side (main body or heating body of the auxiliary heating device) and a cold side (cooling water).

The projection extends in particular over a length between base and tip of at most 40 mm [millimeters], in particular at most 20 mm. With the configuration of a number of projections on the main body, they preferably have a density of at most one projection per square centimeter (1 projection/$cm^2$).

Due to the heat flux in the projection away from the heated main body, a cylindrical projection, for example, has an inhomogeneous temperature profile, and consequently an inhomogeneous delivery of the heat output, along the direction of its extent. Each thermoelectric element has a thermoelectric efficiency that achieves a maximum (maximum efficiency) for a certain temperature difference. The term "thermoelectric efficiency" means herein the quotient of electrical power delivered and thermal output taken up. In order to achieve as high an efficiency as possible for each thermoelectric element, the kind of thermoelectric element is made to match the respective local temperature of the projection, and consequently the temperature difference between the hot side and the cold side.

Alternatively or in addition, the heat flux from the projection to the thermoelectric element may be deliberately (partially) hindered or aided, for example in order to achieve a delivery of the heat output that is as homogeneous as possible, and thus obtain an adaptation to the prescribed thermoelectric efficiency of the thermoelectric element.

A further possibility of adapting the temperature profile is that of adapting the cross section of the projection. It may thus be chosen, for example, as narrowing and/or widening along the direction of its extent, formed (partially) of a porous material and/or having a (partially) rough surface.

In this way, the efficiency of the thermoelectric element can be adapted particularly easily to the delivered heat output of the projection.

It is also proposed herein that the thermoelectric elements are disposed on the at least one projection laterally, that is to say on a circumferential surface. It is similarly preferred that all of the thermoelectric elements have the same electrical efficiency (at the customary operating temperature). Moreover, it is preferred in this case that the delivered heat output of the at least one projection is homogeneous or substantially the same over the entire circumferential surface (for example with respect to correspondingly small reference surfaces).

In accordance with another preferred feature of the invention, the at least one projection on a heated heat-conducting main body has the same temperature over the circumferential surface. The term "same" means in this connection that identical thermoelectric elements can be used over the entire circumferential surface of the projection. The main body or the projection is in this case constructed in such a way that preferably temperature differences of less than 100° C., in particular less than 50° C. and most preferably at most 20° C., are achieved on the circumferential surface, in particular over all of the (dynamic and/or static) load states or heating states. In particular, the temperature on the circumferential surface deviates by a maximum of 30% from the maximum efficiency of the thermoelectric elements being used, preferably even only by a maximum of 15%. If the same temperatures are achieved over the entire circumferential surface, there is no need for the requirement to use different thermoelectric generators with different maximum efficiencies in order to make the heat output respectively delivered match the maximum efficiency of the corresponding generator.

Some materials for thermoelectric elements and the maximum operating temperature thereof are given below by way of example:

| | | |
|---|---|---|
| n-type: | $Bi_2Te_3$ | [about 250° C.]; |
| | PbTe | [about 500° C.]; |
| | $Ba_{0.3}Co_{3.95}Ni_{0.05}Sb_{12}$ | [about 600° C.]; |
| | $Ba_y(Co,Ni)_4Sb_{12}$ | [about 600° C.]; |
| | $CoSb_3$ | [about 700° C.]; |
| | $Ba_8Ga_{16}Ge_{30}$ | [about 850° C.]; |
| | $La_2Te_3$ | [about 1100° C.]; |
| | SiGe | [about 1000° C.]; |
| | $Mg_2(Si,Sn)$ | [about 700° C.]; |
| p-type: | $(Bi,Sb)_2Te_3$ | [about 200° C.]; |
| | $Zn_4Sb_3$ | [about 380° C.]; |
| | TAGS | [about 600° C.]; |
| | PbTe | [about 500° C.]; |
| | SnTe | [about 600° C.]; |
| | $CeFe_4Sb_{12}$ | [about 700° C.]; |
| | $Yb_{14}MnSb_{11}$ | [about 1000° C.]; |
| | SiGe | [about 1000° C.]; |
| | $Mg_2(Si,Sb)$ | [about 600° C.]. |

In accordance with a further preferred feature of the invention, at least one thermoelectric element is separated from the at least one projection, at least in a partial region, by at least one first heat insulator.

In order to adapt the temperature profile of the projection, a first heat insulator is proposed, attached to the projection (in particular to the circumferential surface thereof) (for example as a coating) and reduces the heat flux to the thermoelectric element. The term "heat insulator" should be understood in this case as meaning that the heat flux is not completely prevented by it, but only inhibited. The heat insulator may extend over one or more partial regions of the projection or cover it completely. The heat insulator introduced between the projection and the thermoelectric element has the effect that the projection is no longer in direct thermal contact with the thermoelectric element, at least in partial regions, which is expressed by the term "separated."

It is also proposed to use a number of thermoelectric elements on a projection, to use different thermoelectric elements for different projections and to choose different thermoelectric materials or different material thicknesses for different projections.

In accordance with an added preferred feature of the invention, at least one thermoelectric element is separated from the at least one heated main body, at least in a partial region, by at least one second heat insulator.

The second heat insulator is preferably positioned in this case between a thermoelectric element closest to (adjacent) the main body and the heated main body, in order to avoid peaks in the temperature profile of the projection at the end on the main body side (base) of the projection and avoid an adverse influence (in particular by heat radiation) on the thermoelectric elements. The heat flux is preferably suppressed completely by the second heat insulator. This insulator may be formed of the same material as the first heat conductor, but may also include a different material. The second heat insulator may both be restricted to regions near the projections and take the form of a coating over the entire main body.

In accordance with an additional preferred feature of the invention, the at least one projection has an axial direction and a cross-sectional area that is made to match the thermoelectric efficiency of at least one thermoelectric element in the axial direction of the projection.

The axial direction should often be understood as meaning the direction of extent of the projection from the base to the tip or the front. The cross-sectional area of the projection is considered in the plane perpendicular to the axial direction, and therefore the surface normal runs parallel to the axial direction. The projection is thus constructed in this case in such a way that it has different cross-sectional areas along the axial direction. In this case, the cross-sectional areas may differ, for example, in their form or contour, their size, in the porosity and/or the heat conducting properties of the material. The variation of the cross-sectional area has the effect that the path of the heat flux is shortened or lengthened or hindered or made easier, so that a differing emission of the thermal energy by way of the circumferential surface and along the axial direction is obtained. In this way, the temperature profile of the projection can be influenced specifically, so that it in turn is made to match the thermoelectric efficiency of the thermoelectric element.

In accordance with a concomitant preferred feature of the invention, at least two thermoelectric elements have the same maximum efficiencies.

If a number of thermoelectric elements are used, thermoelectric elements with the same maximum efficiencies are preferably used, so that an adaptation of the maximum efficiency and the delivered heat output to one another is only required by the methods previously mentioned, and there is no need for an adaptation of the materials. Consequently, all of the thermoelectric elements that are attached to the circumferential surface of a projection preferably have the same maximum efficiencies.

A particularly preferred application for the invention is in a motor vehicle, in particular in a passenger motor vehicle, with an internal combustion engine.

Other features which are considered as characteristic for the invention are set forth in the appended claims, noting that the features specified individually in the claims may be combined with one another in any desired technologically expedient manner and provide further refinements of the invention.

Although the invention is illustrated and described herein as embodied in a device for generating electric energy from a heat-conducting material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
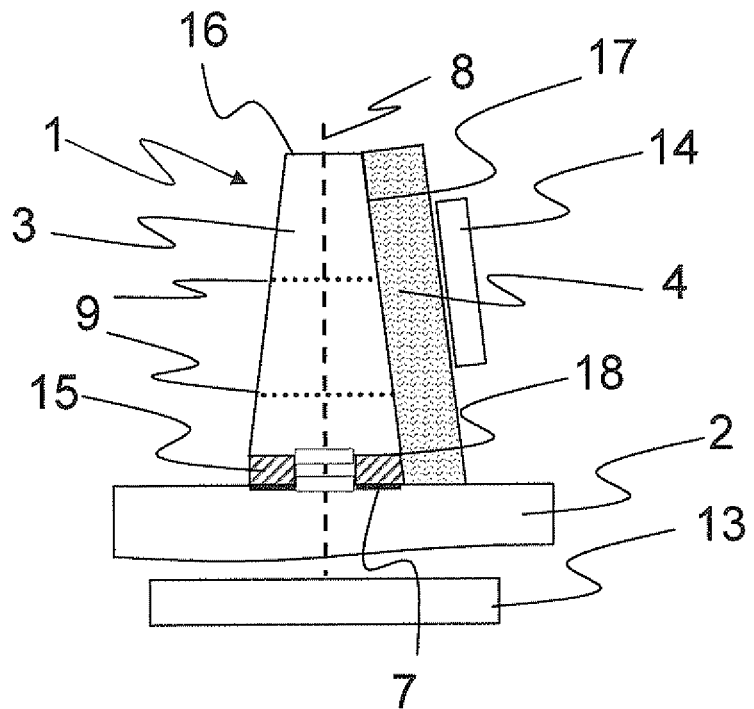
FIG. 1 is a diagrammatic, side-elevational view of a first variant of an embodiment of a device according to the invention, with a projection adapted in cross section.

Referring now to the figures of the drawings in detail and first, particularly, to FIG. 1 thereof, there is seen a first variant of an embodiment of a device 1 having a main body 2 which is heated by a heating device 13 (for example a burner), a projection 3 and a thermoelectric element 4 which is attached laterally to the projection 3 and is cooled by a cooling device 14. The projection 3 is separated from the heated main body 2 in partial portions 7 by second heat insulators 15, so that temperature peaks at a base 18 of the projection 3 are avoided. Furthermore, the projection 3 has different cross-sectional areas 9 along its axial direction 8, so that a delivered heat output of the projection 3 is adapted to the efficiency of the thermoelectric element 4. In the case of the variant shown herein, the thermoelectric element 4 extends from the base 18 along a circumferential surface 17 to a front 16 of the projection 3. In principle, however, the number and orientation or positioning of the thermoelectric elements 4 may be given various forms for the purpose of adaptation.

The figures referred to below present, to some extent, the same components, which are also identified there by the same designations.

Figure 2:
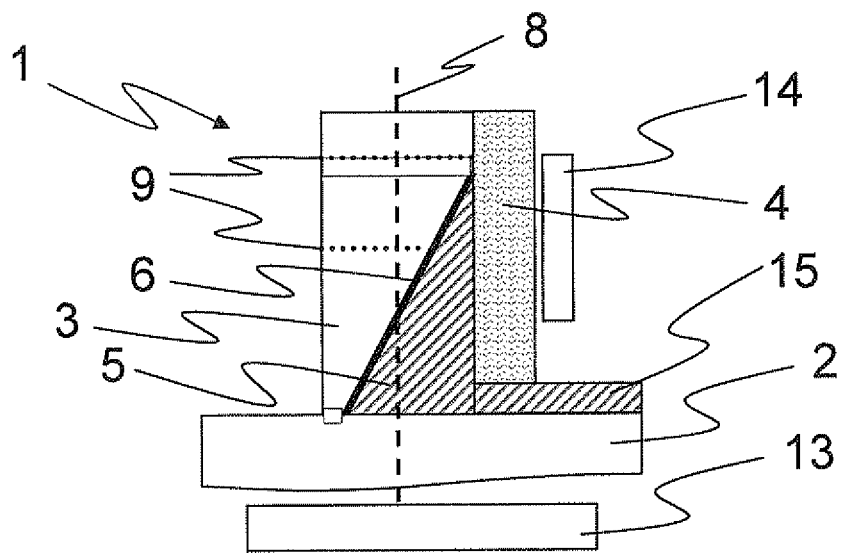
FIG. 2 is a side-elevational view of a second variant of an embodiment of the device with a projection adapted in cross section and an additional first heat insulator.

FIG. 2 shows a second variant embodiment of the device 1. The projection 3 is separated from the thermoelectric elements 4 in partial regions 6 by a first heat insulator 5 and has different cross-sectional areas 9 along the axial direction 8. The first heat insulator 5 also has different cross sections, which are adapted to the cross-sectional areas 9 of the projection 3. The thermoelectric elements 4 are attached laterally to the projection 3 and the first heat insulator 5 and are separated from the heated main body 2 by a second heat insulator 15. The adaptation of the delivered heat output to the efficiency of the thermoelectric element 4 takes place in this exemplary embodiment both by the geometry of the first heat insulator 5 and by the different cross-sectional areas 9 of the projection 3.

Figure 3:
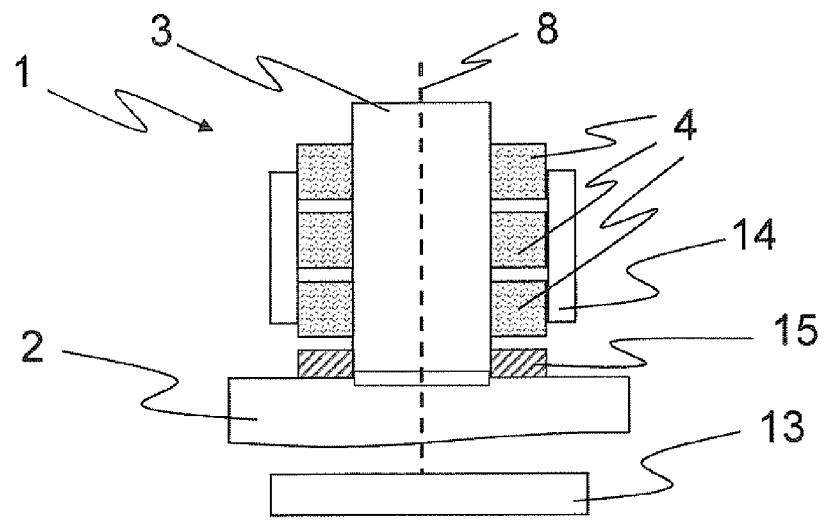
FIG. 3 is a side-elevational view of a third variant of an embodiment of the device with a number of thermoelectric elements.

FIG. 3 shows a third variant embodiment of the device 1. The thermoelectric elements 4 are separated from the heated main body 2 by a second heat insulator 15. The adaptation of the delivered heat output of the projection 3 to the efficiencies of the thermoelectric element 4 takes place by the thermoelectric elements 4 being provided with different maximum efficiencies.

Figure 4:
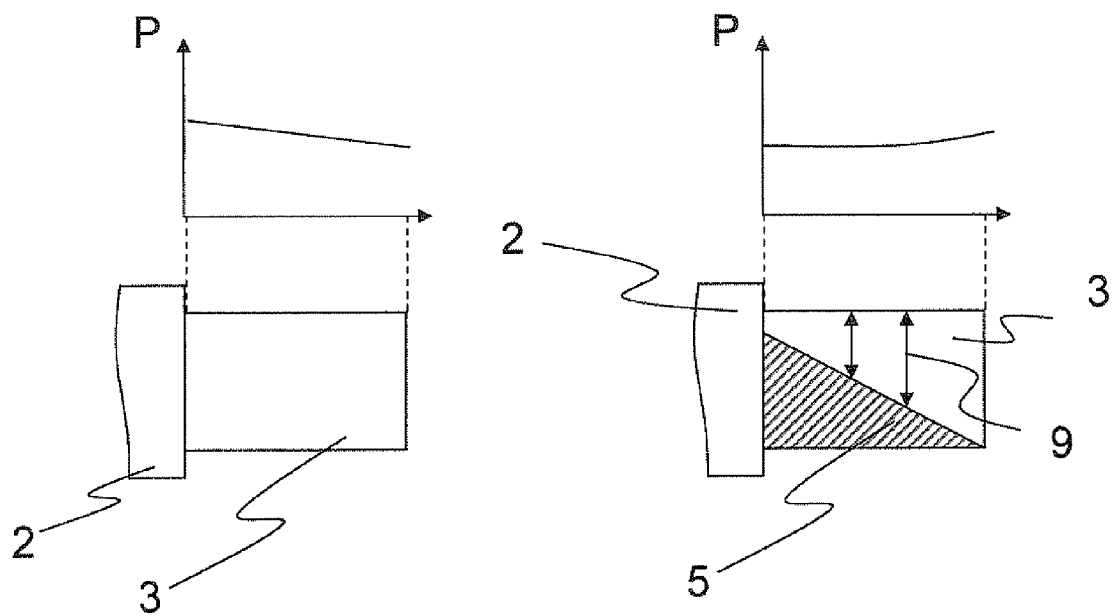
FIG. 4 is a side-elevational view showing an integration of a device for generating electrical energy from hot exhaust gas of a motor vehicle.

FIG. 4 illustrates the delivered heat output of the projection 3. The illustration on the left shows a cylindrical projection 3 without the first heat insulator 5. In this case, a heat output P which is delivered decreases along the axial direction 8 from the base to the front. The illustration on the right shows a projection 3 with a first heat insulator 5 and different cross-sectional areas 9 of the projection 3 in the axial direction 8. The heat output P which is delivered increases along the axial direction 8 of the projection 3.

Figure 5:
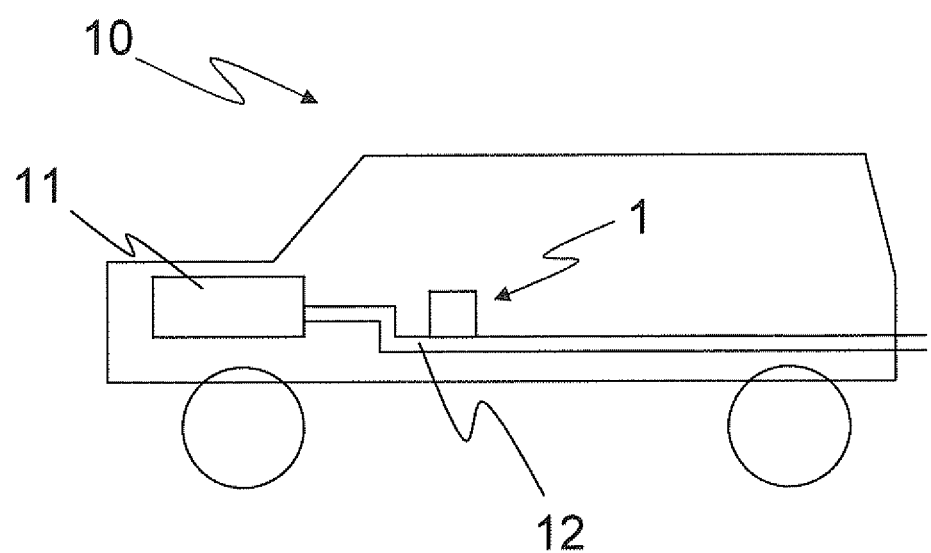
FIG. 5 is a longitudinal-sectional view of a motor vehicle with a corresponding device.

FIG. 5 shows a motor vehicle 10 with an internal combustion engine 11, which produces an exhaust gas 12, that is emitted by way of an exhaust system, which is in thermal contact with the device 1. This allows electrical energy to be obtained from the thermal energy of the exhaust gas 12 of the motor vehicle 10. It is preferred in this case that the heating of the thermoelectric generator not be provided (only) by the exhaust gas, but that rather at least one burner and/or an electrical heating device is provided, providing a solid baseplate with a constant supply of heat.

The invention claimed is:

1. A device for generating electrical energy, the device comprising:
   at least one heated heat-conducting main body;
   at least one projection attached to said heated heat-conducting main body and delivering a heat output, said at least one projection having at least one of a partial region or a partial portion;
   a plurality of thermoelectric elements attached laterally to said at least one projection and having a thermoelectric efficiency, said plurality of thermoelectric elements each including respective p-doped and n-doped semiconductor blocks;
   said at least one projection hindering or aiding heat flux from said at least one projection to said thermoelectric elements to cause the delivery of said heat output to said thermoelectric elements to be proportional to said thermoelectric efficiency of each of said thermoelectric elements;
   said thermoelectric efficiency of each of said thermoelectric elements and said heat output delivered by said at least one projection being proportional to one another causing homogeneity of the delivery of said heat output to increase; and
   at least one of:
      at least one first heat insulator separating at least one of said thermoelectric elements from said at least one projection at least in said partial region, or
      at least one second heat insulator separating at least one of said thermoelectric elements from said at least one heated heat-conducting main body at least in said partial portion;
   said at least one first or said at least one second heat insulator causing an otherwise inhomogeneous temperature profile of said projection and consequently an inhomogeneous delivery of said heat output to said plurality of thermoelectric elements, due to said heat flux in said projection away from said heated main body, to become homogeneous; and
   said at least one first and said at least one second heat insulators hindering said heat flux toward said thermoelectric elements.

2. The device according to claim 1, wherein said at least one projection has a circumferential surface, is disposed on said heated heat-conducting main body and has the same temperature over said circumferential surface.

3. The device according to claim 1, wherein said at least one projection has an axial direction and different cross-sectional areas with variations along said axial direction, said variations of said cross-sectional areas influencing a temperature profile of said at least one projection and causing said temperature profile to match said thermoelectric efficiency of at least one of said thermoelectric elements.

4. The device according to claim 1, wherein at least two of said thermoelectric elements have the same maximum efficiencies.

5. The device according to claim 1, wherein said at least one projection has a circumferential surface, and said heat output delivered by said at least one projection is homogeneous or substantially the same entirely over said circumferential surface.

6. The device according to claim 1, wherein said at least one projection has an axial direction, a base attached to said main body, a tip, a length between said base and said tip extending in said axial direction, and a circumferential surface between said base and said tip to which said thermoelectric elements are attached.

7. The device according to claim 1, wherein said plurality of thermoelectric elements including said respective p-doped and n-doped semiconductor blocks are disposed at different locations on said at least one projection relative to said at least one heated heat-conducting main body.

* * * * *